United States Patent [19]

Matsumoto et al.

[11] Patent Number: 4,994,642
[45] Date of Patent: Feb. 19, 1991

[54] SHEET HEATING DEVICE

[75] Inventors: Yumio Matsumoto, Kasugai; Yasuo Kimura, Ichinomiya; Osamu Takagi, Nagoya, all of Japan

[73] Assignee: Brother Kogyo Kabushiki Kaisha, Aichi, Japan

[21] Appl. No.: 425,919

[22] Filed: Oct. 24, 1989

[30] Foreign Application Priority Data

Oct. 25, 1988 [JP] Japan ............... 63-139771[U]
Oct. 25, 1988 [JP] Japan ............... 63-139772[U]
Oct. 25, 1988 [JP] Japan ............... 63-139773[U]
Oct. 25, 1988 [JP] Japan ............... 63-139774[U]
Oct. 25, 1988 [JP] Japan ............... 63-139775[U]

[51] Int. Cl.⁵ .......................................... G03G 15/20
[52] U.S. Cl. ................................. 219/388; 219/216; 355/291
[58] Field of Search ............. 219/216, 400, 388; 355/291

[56] References Cited

U.S. PATENT DOCUMENTS

Re. 28,802  5/1976  Draugelis ............. 219/216
3,440,944   4/1969  Endermann .......... 219/388
4,148,575   5/1979  Siryj ..................... 219/216
4,639,405   1/1987  Franke ................. 219/216
4,745,432   5/1988  Langdon .............. 219/216

Primary Examiner—Teresa J. Walberg
Attorney, Agent, or Firm—Oliff & Berridge

[57] ABSTRACT

A color copying machine has a sheet heating device for heating a color developer sheet while the sheet is being fed. The sheet heating device includes a sheet feed path along which the sheet is fed, a heater unit spaced from the sheet feed path, and a sheet protective member of an insulating material disposed between the sheet feed path and the heater unit. The sheet protective member has a plurality of holes defined therein for passing radiant heat from the heater unit toward the sheet feed path. The sheet protective member may comprise a mesh screen of intersecting filaments or a punched iron sheet.

12 Claims, 4 Drawing Sheets

SHEET HEATING DEVICE

BACKGROUND OF THE INVENTION

The present invention relates to a sheet heating device for heating a sheet with a heater while feeding the sheet along a sheet feed path.

Various copying machines employ a drier-type fixing device for fixing a developed image on a sheet of paper or the like with air heated by a heater and applied to the sheet protective member disposed between a sheet feed path and the heater and having a number of small holes for the passage therethrough of heat radiation from the heater. The sheet protective member serves to prevent the sheet from being attracted to or caught by the air blower, or from getting jammed in the sheet feed path.

The proposed sheet protective member is in the form of a metal mesh screen. Therefore, it is necessary to provide a wide insulating gap of 4 mm or more between the heater and the metal mesh screen. The wide insulating gap results in a reduction in the thermal efficiency of the heater.

The metal mesh screen comprises a number of intersecting woven metal wires. The intersecting points of the metal wires however tend to serve as an obstacle to the leading edge of the sheet as it is fed along the sheet feed path. Therefore, the sheet protective member is still ineffective to prevent a sheet jam.

Another proposed metal mesh screen is made up of a number of parallel metal wires extending along the direction in which the sheet is fed through the sheet feed path. The metal wires obstruct the uniform application of hot air from the heater to the sheet. As a result, the sheet is subjected to striped heat irregularities on its surface, so that color irregularities may be caused on the sheet or the sheet may not be calendared uniformly.

The metal mesh screen is fixed to a support frame by screws or welding. However, the sheet protective member of such an arrangement is expensive to construct. There has also been proposed a plate-like sheet protective member having a plurality of slits extending along the sheet feeding direction. However, the sheet as it travels along the sheet feed path tends to be caught by downstream ends of the slits.

SUMMARY OF THE INVENTION

It is an object of the present invention to provide a sheet heating device including a heater and a sheet protective member which are insulated from each other while being closely spaced from each other, with the heater having an increased thermal efficiency.

Another object of the present invention is to provide a sheet heating device which prevents a sheet from displaced toward a heater and reliably guides the sheet toward a feed roller while preventing a sheet jam in a sheet feed path.

Still another object of the present invention is to provide a sheet heating device which uniformly heats a sheet without heat irregularities which would otherwise be caused by a sheet protective mesh screen positioned between the heater and the sheet.

Yet another object of the present invention is to provide a sheet heating device which includes a sheet protective member having heat radiation holes spaced to prevent a sheet from being caught by edges of the heat radiation holes.

Yet still another object of the present invention is to provide a sheet heating device which can be manufactured inexpensively.

A still further object of the present invention is to provide a sheet heating device capable of smoothly feeding a sheet without a jam while heating the sheet.

According to the present invention, there is provided a sheet heating device for heating a sheet while the sheet is being fed, comprising a sheet feed path along which the sheet is fed, a heater unit spaced from the sheet feed path; and a sheet protective member of an insulating material disposed between the sheet feed path and the heater unit, the sheet protective member having a plurality of holes defined therein for passing a heated air from the heater unit toward said sheet feed path.

A sheet protective member includes a mesh screen comprising filaments of glass fibers.

The filaments are divided into two sets of filaments, the filaments of one set extending along the sheet feed path and the filaments of the other set extending transversely to the sheet feed path. The filaments of one set are positioned more closely to the sheet feed path than the filaments of the other set. The two sets of filaments are joined to each other at their intersecting points.

The sheet heating device further including a roller for discharging the sheet heated by the heater unit, the sheet protective member being progressively inclined toward the sheet feed path along a direction toward said roller. Stated otherwise, the filaments of one set providing a sheet guide surface facing the sheet feed path, for guiding the sheet toward the roller, the sheet guide surface being progressively inclined toward the sheet feed path along a direction toward the roller.

The two sets of filaments may lie in a plane substantially parallel to the sheet feed path and being inclined to the sheet feed path, and being arranged so as to intersect to a sheet feeding direction at a prescribed angle.

The holes are divided into two sets of holes, the holes of one set being inclined from a central axis of the sheet feed path toward one side of the sheet protective member, and the holes of the other set being inclined from said central axis toward the other side of the sheet protective member. The sheet protective member comprises an iron sheet with the holes defined therein.

DETAILED DESCRIPTION OF THE PREFERRED EMBODIMENTS

Figure 1:
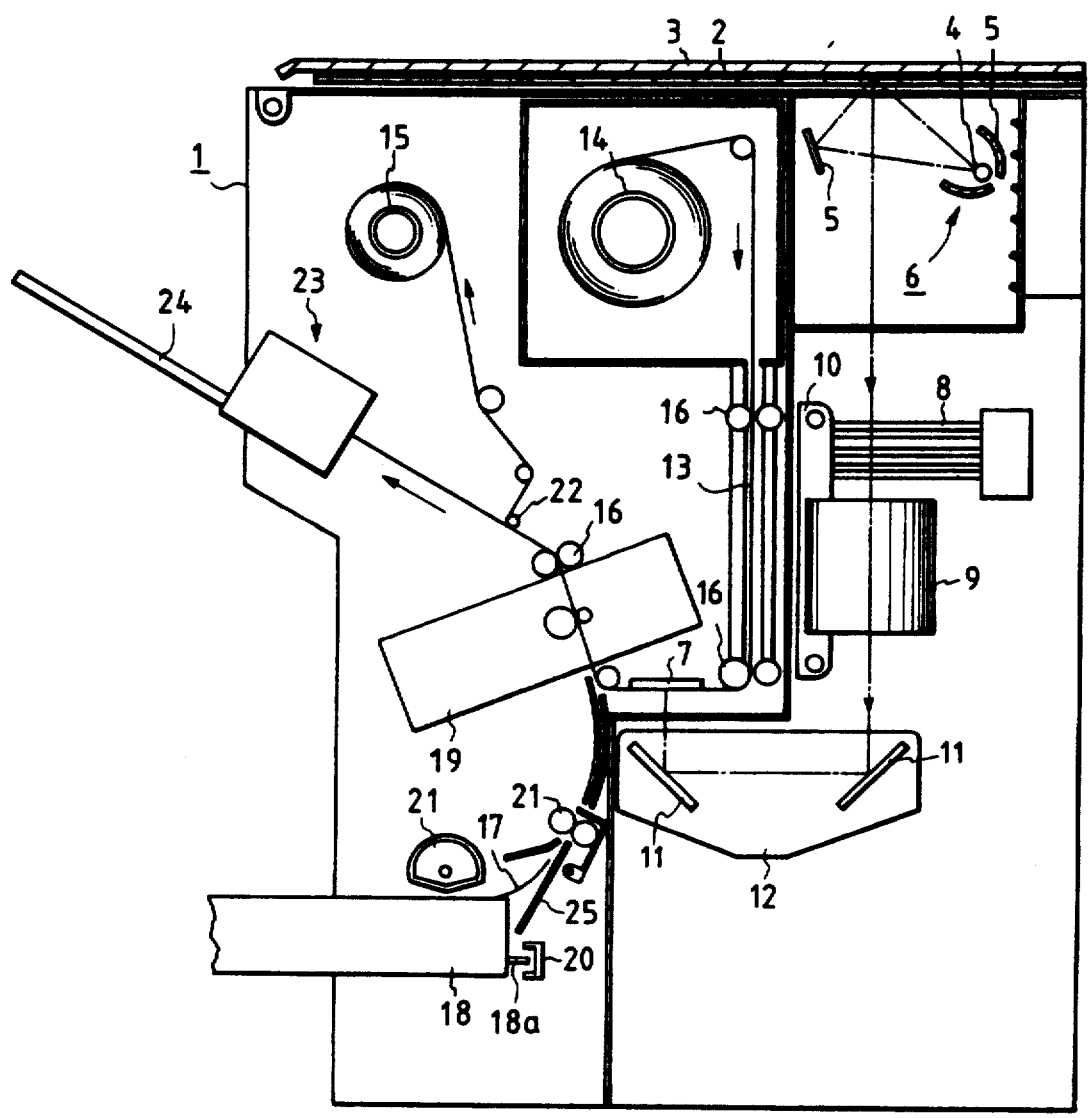
FIG. 1 is a schematic vertical cross-sectional view of a copying machine incorporating a sheet heating device according to the present invention.

Like or corresponding parts are denoted by like or corresponding reference numerals throughout views.

FIG. 1 shows a color copying machine incorporating a sheet heating device in accordance with the present invention. The copying machine includes a housing 1 on which there are mounted an original holder 2 of a glass for placing an original document to be copied and a cover 3 for operably covering the original holder 2. The original holder 2 and the cover 3 are horizontally movable on the top of the housing 1. A light source 6 for emitting light is disposed below the original holder 2. The light source 6 comprises a halogen lamp 4 for emitting light, and a reflecting mirror 5 for reflecting the emitted light toward an original document placed on the original holder 2. The original document on the original holder 2 can two-dimensionally scanned or irradiated by the light when the subject holder 2 is horizontally moved over and across the light source 6 while the light is being emitted from the light source 6.

An exposure table 7 is located substantially centrally in the housing 1. Between the light source 6 and the exposure table 7, there are positioned a filter 8 for adjusting the colors of a reproduced image, and a condenser lens 9 for concentrating the light reflected from the original document on the original holder 2 and passing through the filter 8. The filter 8 and the condenser lens 9 are supported by an attachment plate 10 which is positioned below the light source 6. A pair of horizontally spaced reflecting mirrors 11 is positionally adjustably supported on an attachment plate 12 positioned below and between the condenser lens 9 and the exposure table 7. The reflecting mirror 11 serve to adjust the length of the optical path from the original holder 2 to the exposure table 7 and also focus an image on the exposure table 7. The light applied to and reflected from the original document on the original holder 2 passes through the filter 8 and the condenser lens 9, and is then reflected by the reflecting mirrors 11 toward the exposure table 7.

A cartridge 14 is detachably mounted in an upper portion of the housing 1, and a takeup shaft 15 is rotatably supported also in the upper portion of the housing 1. The cartridge 14 stores a roll of elongated microcapsule sheet 13 which are coated with microcapusules containing dyes for reproducing color images. The microcapsule sheet 13 is withdrawn from the cartridge 14 and wound around the takeup shaft 15 by a plurality of feed rollers 16 which are positioned along a sheet feed path between the cartridge 14 and the takeup shaft 15. While the microcapsule sheet 13 is being fed along the sheet feed path, a portion of the microcapsule sheet 13 which passes underneath the exposure table 7 is exposed to the light from the original document, so that a latent image of the original document is formed on the exposed region of the microcapsule sheet 13.

A cassette 18 accommodating a stack of color developer sheets 17 of a certain size is detachably mounted in a lower portion of the housing 1 below the exposure table 7. A pressure developing unit 19 for developing a latent image under pressure is disposed between the exposure table 7 and the takeup shaft 15. The exposed region of the microcapsule sheet 13 and a color developer sheet 17 are superposed and pressed against each other in the pressure developing unit 19, thus forming a color image on the color developer sheet 17 based on the latent image on the microcapsule sheet 13.

The cassette 18 has a finger 18a projecting from one and thereof, the finger 18a being designed, positioned, or otherwise characterized depending on the size of the color developer sheet 17 contained in the cassette 18. A size detector 20 for detecting the size of the color developer sheets 17 in the cassette 18 by detecting the size, position, or the like of the finger 18a is disposed in the housing 1 near the cassette 18.

A plurality (a pair in FIG. 1) of feed rollers 21 for feeding a color developer sheet 17 toward the pressure developing unit 19 are disposed between the cassette 18 and the pressure developing unit 19. A sheet guide 25 for guiding a color developer sheet 17 toward the pressure developing unit 19 is positioned between the feed rollers 21 and the pressure developing unit 19. A separator roller 22 for separating a color developer sheet 17 from the microcapsule sheet 13 is disposed downstream of the pressure developing unit 19 with respect to the sheet feed path of the microcapsule sheet 13. A sheet heating device 23 according to the present invention for thermally fixing a developed image on a color developer sheet 17 is positioned downstream of the separator roller 22 with respect to the direction in which the color developer sheet 17 is fed from the pressure developing unit 19. The color developer sheet 17 discharged from the sheet heating device 23 is fed onto a tray 24 attached to the housing 1.

The copying machine thus constructed operates as follows: When a start button (not shown) is depressed, the original holder 2 is horizontally moved to the rightmost end of its stroke until the lefthand end of an original document placed on the original holder 2 faces the halogen lamp 4, which is then turned on. Thereafter, the original holder 2 is moved back to the left during which time light emitted from the light source 6 is applied to the original document.

While the original document is being irradiated by the light, the microcapsule sheet 13 is moved across the exposure table 7 from the cartridge 14 to the takeup shaft 15 at the same speed as the speed of travel of the original holder 2. Therefore, a latent image of the original document on the original holder 2 is formed on the microcapsule sheet 13 by the light reflected from the original document, passing through the filter 8 and the condenser lens 9, and reflected by the reflecting mirrors 11. In synchronism with the return of the original holder 2 to the left, a color developer sheet 17 is taken out of the cassette 18 and delivered to the pressure developing unit 19. In the pressure developing unit 19, the exposed region of the microcapsule sheet 13 is pressed against the color developer sheet 17, thereby forming a color image on the color developer sheet 17. Thereafter, the color developer sheet 17 is introduced by the feed rollers 16 and the separator roller 22 into the sheet heating device 23 in which the color image is fixed with applied heat. The color developer sheet 17 with the fixed color image is then discharged onto the tray 24.

Figure 2:
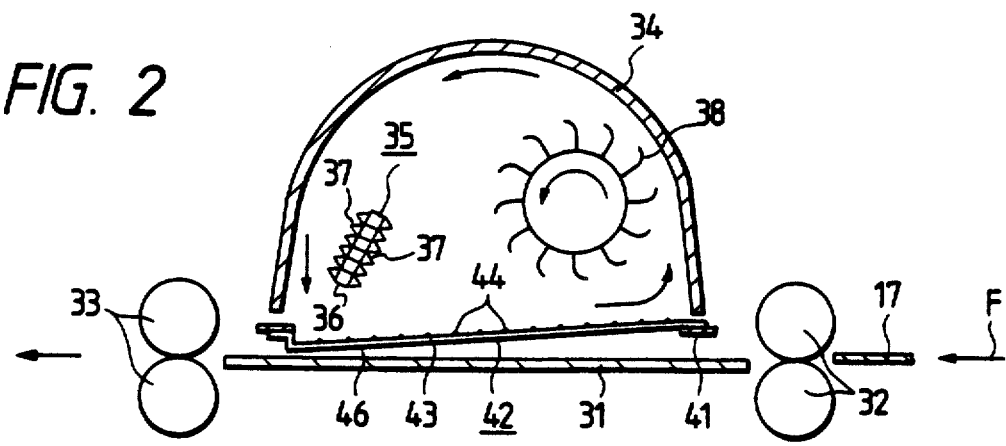
FIG. 2 is a cross-sectional view of a sheet heating device according to an embodiment of the present invention.
Figure 3:
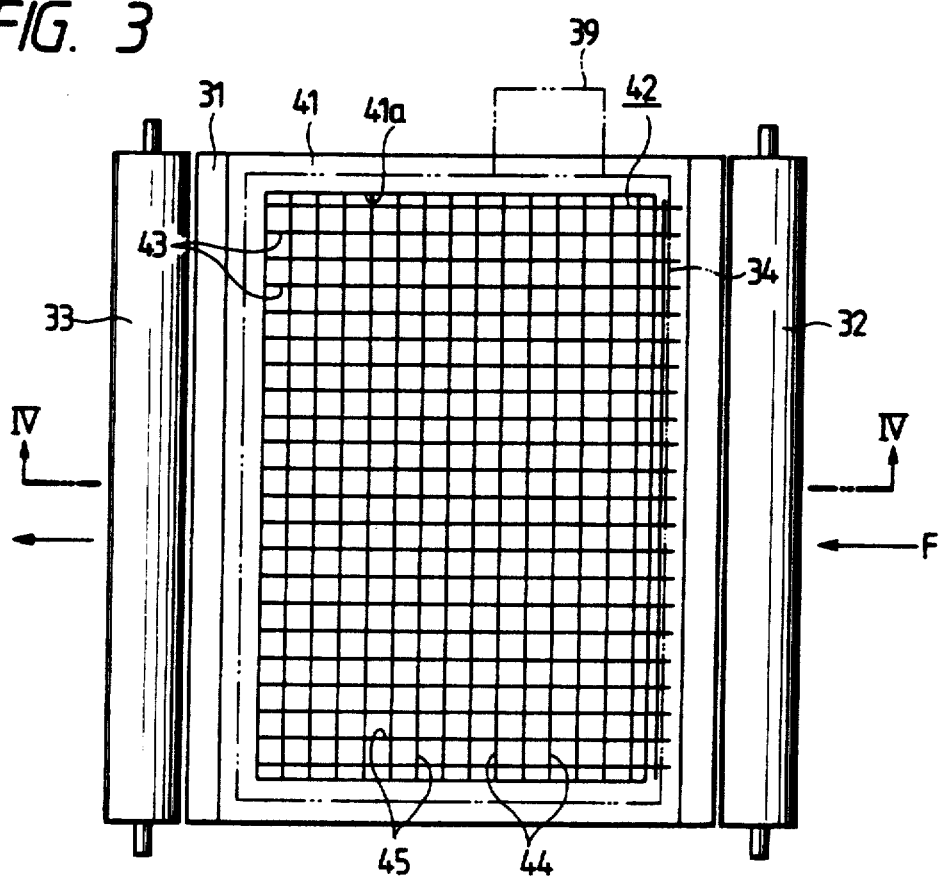
FIG. 3 is a plan view of the sheet heating device shown in FIG. 2.
Figure 4:
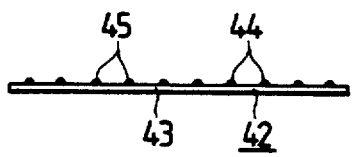
FIG. 4 is an enlarged fragmentary cross-sectional view taken along line IV—IV of FIG. 3.

FIGS. 2, 3, and 4 illustrate a sheet heating device 23 according to an embodiment of the present invention.

As shown in FIG. 2, the sheet heating device 23 has a guide plate 31 of iron extending along a sheet feed path of a color developer sheet 17. A pair of inlet rollers 32 and a pair of outlet rollers 33 are rotatably disposed respectively on inlet and outlet sides of the guide plate 31. The inlet and outlet rollers 32, 33 have their axes extending perpendicularly to the sheet feed path. The inlet rollers 32 are positioned above and below, respectively, the sheet feed path, and the outlet rollers 33 are also positioned above and below, respectively, the sheet feed path. When the rollers 32, 33 rotate about their own axes, the color developer sheet 17 is fed on and along the sheet feed surface of the guide plate 31 in the sheet feeding direction indicated by the arrow F.

A cover 34 having an arch-shaped cross section is positioned on the guide plate 31. A heater unit 35 is disposed in the cover 14 near the outlet side of the guide plate 31 in confronting relation to an inner wall surface of the cover 34. The heater unit 35 includes an elongated heat insulating base plate 36 made of electrically insulating material such as ceramic. The base plate 36 extends substantially the full width of the guide plate 31 in a direction normal to the sheet feeding direction F. The heater unit 35 also has a coil heater 37 wound around the base plate 36 and composed of electrically connected turns disposed on the opposite outer surfaces of the base plate 36 and spaced at certain intervals.

A cross-flow fan 38 for supplying an air flow toward the heater unit 35 is disposed in the cover 34 behind the heater unit 35, i.e., near the inlet side of the guide plate 31, and spaced vertically from the guide plate 31. The cross-flow fan 38 extends the full width of the guide plate 31 across the sheet feed path along the sheet feeding direction F. The cross-flow fan 38 is rotatable about its own axis parallel to the axes of the rollers 32, 33 and also the heater unit 35. The cross-flow fan 38 can be rotated counterclockwise in FIG. 2 by a motor 39 (FIG. 3) mounted on an outer side surface of the cover 34 and coupled to the shaft of the air blower 38, for thereby circulating air in the direction indicated by the arrows in FIG. 2.

A centrally open rectangular frame 41 of sheet metal is disposed between the guide plate 31 and the cover 34, and a sheet protective mesh screen 42 is mounted on the frame 41 in covering relation to the central opening 41a of the frame 41. The mesh screen 42 is constructed of two sets of electrically insulating filaments 43, 44 (each having a diameter ranging from 2 mm to 4 mm) comprising glass fibers. The filaments 43 of the first set are positioned more closely to the guide plate 31 and spaced at intervals across the sheet feeding direction F. The filaments 43 extend substantially parallel to each other along the sheet feeding direction F. The filaments 43 have upstream ends (righthand ends as shown) fixed to the upper surface of the frame 41, and downstream ends (lefthand ends as shown) fixed to the lower surface of the frame 41.

As illustrated in FIGS. 3 and 4, the filaments 44 of the second set are disposed on and over the filaments 44 and extend substantially perpendicularly to the filaments 44. The filaments 44 are spaced at intervals along the sheet feed path and parallel to each other. The filaments 43, 44 are fixed to each other at intersecting points, and define therebetween a number of heat radiation holes 45 each having a side ranging from 4 to 8 mesh. The heater 37 and the sheet protective mesh screen 42 are spaced from each other by a distance smaller than 4 mm.

The filaments 43 are inclined with respect to the guide plate 31 such that they are spaced from the guide plate 31 by a distance which is progressively smaller downstream along the sheet feed path (i.e., from the right to the left in FIG. 2). The inclined filaments 43 provide a guide surface 46 facing the guide plate 31 for guiding a color developer sheet 17 toward the outlet rollers 33.

While the coil heater 37 is being energized and the cross-flow fan 38 is being rotated by the motor 39, heated air circulates in the cover 34, and the heated air is passed through the heat radiation holes 45 of the sheet protective mesh screen 42 toward the guide plate 31.

When the inlet rollers 32 are rotated, a color developer sheet 17 is introduced into the cover 34 through the inlet slot defined between the guide plate 31 and the sheet protective mesh screen 42. Then, the color developer sheet 17 is discharged out of the cover 34 by rotation of the outlet rollers 33. While the color developer sheet 17 is traveling over the guide plate 31 within the cover 34, the color developer sheet 17 is heated by the heat applied through the heat radiation holes 45 to fix the image on the color developer sheet 17.

Even if the leading end of the color developer sheet 17 happens to rise toward the heater 35 while the color developer sheet 17 is traveling through the cover 34, the color developer sheet 17 is reliably prevented by the sheet protective mesh screen 42 from being displaced into the cover 34. Therefore, the color developer sheet 17 is protected from being attracted to and caught by the cross-flow fan 38 and the heater 37.

While the color developer sheet 17 is being fed along the sheet feed path in the sheet feeding direction F (FIG. 3), the color developer sheet 17 is reliably guided toward the outlet rollers 33 along the guide surface 46 of the sheet protective mesh screen 42, and is prevented from getting caught and jammed by the sheet protective mesh screen 42. Stated otherwise, the filaments 43 extending along the sheet feeding direction F are positioned in facing relation to the guide plate 31, and the filament 44 crossing the filaments 43 are positioned closely to the heater 35. Therefore, even if the color developer sheet 17 happens to be deflected off the guide plate 31 toward the heater 35, the color developer sheet 17 is reliably fed toward the outlet rollers 33 by contact with only the filaments 43. Consequently, the color developer sheet 17 is not caught by the intersecting points of the filaments 43, 44, and can smoothly be fed without a jam.

Since the filaments 43, 44 are in the form of glass fibers, the distance, which is smaller than 4 mm, between the sheet protective mesh screen 42 and the heater 35 may be smaller than if the filaments were made of an electrically conductive material. Therefore, radiant heat from the heater 37 can effectively be utilized for higher thermal efficiency.

The filaments 43, 44 may be made of any of various insulating materials other than glass fibers. Another guide member defining a sheet guide surface may be mounted on the frame 41 independently of the sheet protective mesh screen 42, or only a sheet protective member comprising a punched metal sheet or the filaments 43 may be employed.

Figure 5:
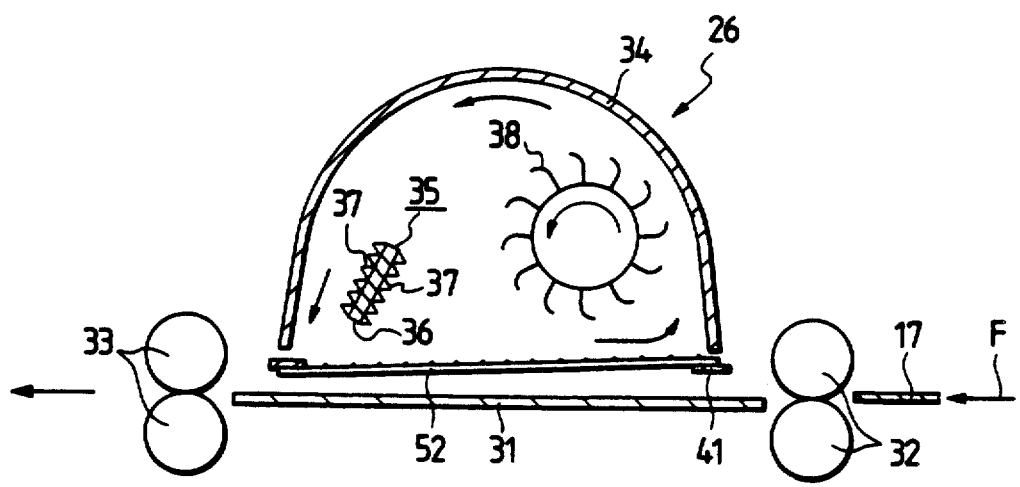
FIG. 5 is a cross-sectional view of a sheet heating device according to another embodiment of the present invention.
Figure 6:
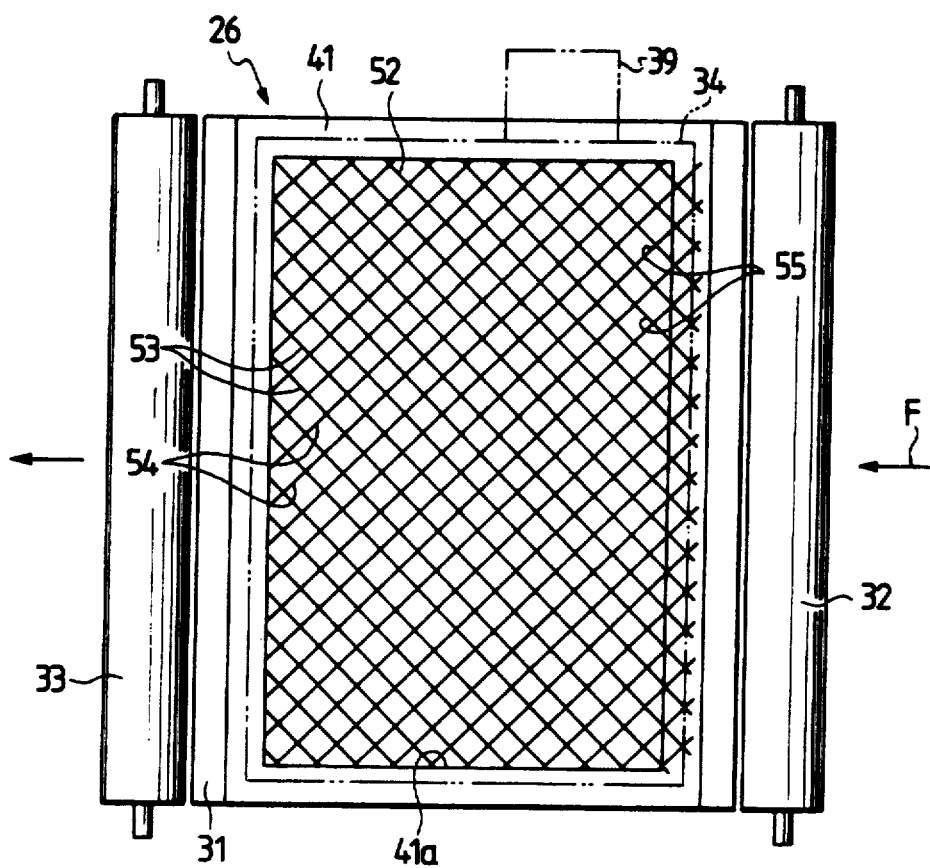
FIG. 6 is a plan view of the sheet heating device shown in FIG. 5.

FIGS. 5 and 6 show a sheet heating device 26 according to another embodiment of the present invention. The sheet heating device 26 differs from the sheet heating device 23 shown in FIGS. 2 through 4 in that a sheet protective mesh screen 52 has two sets of diagonal filaments 53, 54 comprising glass fibers (each having a diameter ranging from 2 mm to 4 mm). More specifically, the filaments 53 extend at an angle of about 45° to the sheet feed path along the sheet feeding direction F, and the filaments 54 extend at an angle of about 45° to the sheet feed path along the sheet feeding direction F, the filaments 53, 54 crossing each other at an angle of about 90°. The filaments 53, 54 are joined to each other at their intersecting points, and jointly define heat radiation holes 55. The other structural details are the same as those shown in FIGS. 2 through 4.

The sheet protective member 52 serves to prevent a color developer sheet 17 from being displaced into the cover 34 and to allow the color developer sheet 17 to be fed smoothly toward the outlet rollers 33. In addition, radiant heat from the heater 37 is not obstructed by the filaments 53, 55 and is uniformly applied to the color developer sheet 17 as it is fed along since the filaments 53, 54 extend diagonally in the opening 41a of the frame 41. No striped heat irregularities are produced on the color developer heat 17 because the color developer sheet 17 receives uniform heat energy while it is progressively moving below the diagonally crossing filaments 53, 54.

The sets of filaments 53, 54 may cross each other at different angels from 45°, and may be made of stainless steel.

Figure 7:
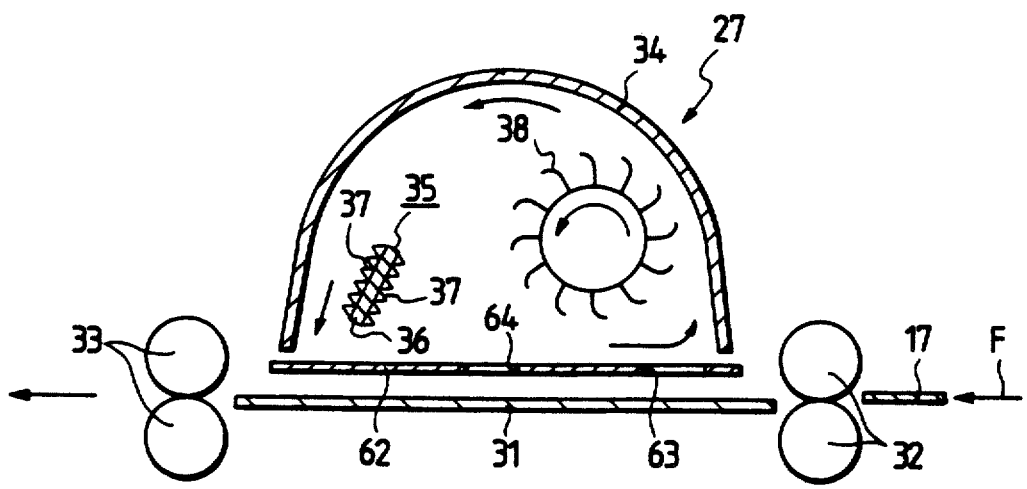
FIG. 7 is a cross-sectional view of a sheet heating device according to still another embodiment of the present invention.
Figure 8:
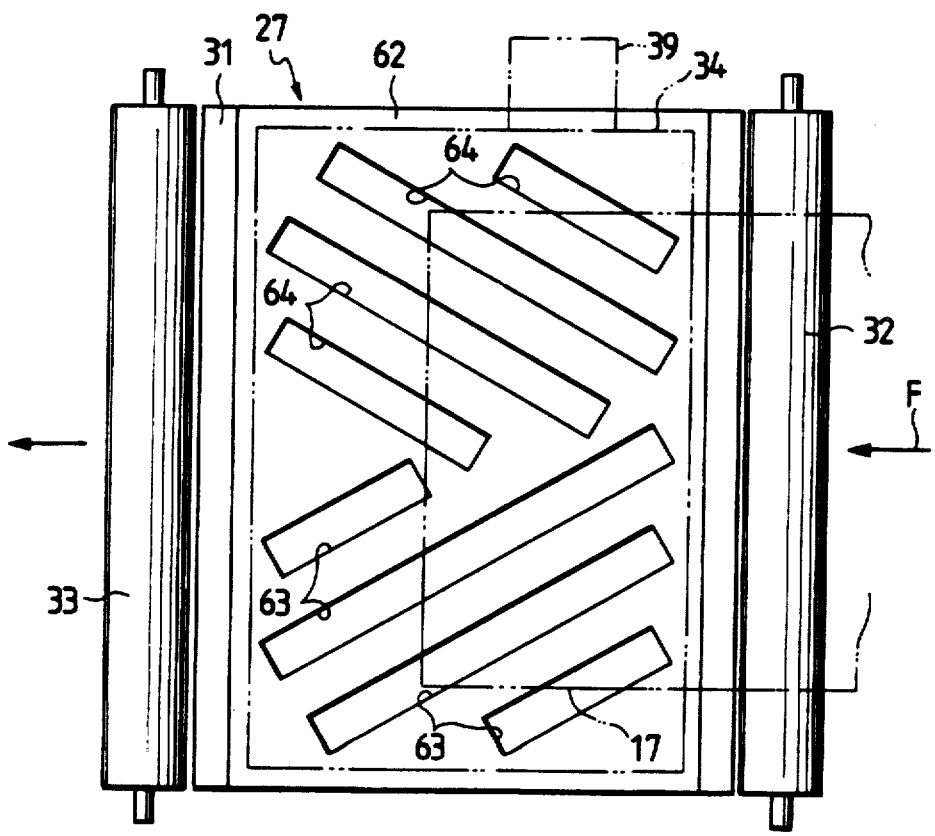
FIG. 8 is a plan view of the sheet heating device shown in FIG. 7.

According to still another embodiment shown in FIGS. 7 and 8, a sheet heating device 27 includes a sheet protective member 62 in the form of an iron sheet extending substantially parallel to the guide plate 31. The sheet protective member 62 has two sets of heat radiation holes or slots 63, 64 defined therein. The heat radiation holes 63 of one set extend obliquely from the central axis of the sheet protective member 62 along the sheet feeding direction F toward one side of the sheet protective member 62, whereas the heat radiation holes 64 of the other set extend obliquely from the central axis toward the other side of the sheet protective member 62. The heat radiation holes 63, 64 are progressively inclined away from each other in the sheet feeding direction F.

Even when a corner of a color developer sheet 17 at its leading end enters one of the heat radiation holes 63, 64 and projects upwardly above the sheet protective member 62 while the color developer sheet 17 is being fed along the sheet feed path in the sheet feeding direction F, the upwardly projecting corner of the color developer sheet 17 is smoothly guided by an inner edge of the heat radiation hole into a position below the sheet protective member 62, because the heat radiation holes 63, 64 are progressively inclined outwardly in the sheet feeding direction F. Therefore, the color developer sheet 17 is smoothly fed along without a jam.

Radiant heat from the heater 37 is uniformly applied to the color developer sheet 17 as it is fed below the sheet protective member 62. More specifically, since the heat radiation holes 63, 64 are progressively inclined outwardly, the upper surface of the color developer sheet 17 is entirely exposed to heat energy through the inclined heat radiation holes 63, 64 while the color developer sheet 17 is being progressively fed along. Therefore, no heat irregularities are produced on the color developer sheet 17, but uniform heat radiation reaches the color developer sheet 17.

The sheet protective member 62 in the form of a punched iron sheet is inexpensive to manufacture.

The number, size, and angles of the heat radiation holes 63, 64 are not limited to the illustrated examples, but can freely be selected.

In each of the aforesaid embodiments, the cross-flow fan 38 may be dispensed with.

In the color copying machine shown in FIG. 1, color developer sheets including a base in the form of a transparent plastic film may be employed. The sheet heating device of the present invention may be incorporated in a monochromatic copying machine.

Although certain preferred embodiments have been shown and described, it should be understood that many changes and modifications may be made therein without departing from the scope of the appended claims.

What is claimed is:

1. A sheet heating device for heating a sheet while the sheet is being fed, comprising:
    a sheet feed path along which the sheet is fed;
    a heater unit spaced from said sheet feed path; and
    a slotted screen sheet protective member disposed between said sheet feed path and said heater unit, said sheet protective member having a plurality of holes defined therein for passing a heated air from said heater unit toward said sheet feed path, said holes extending in a direction inclined to the sheet feed path.

2. A sheet device according to claim 1, wherein said sheet protective member comprises an iron sheet with said holes defined therein.

3. A sheet heating device for heating a sheet while the sheet is being fed, comprising:
    a sheet feed path along which the sheet is fed;
    a heater unit spaced from said sheet feed path; and
    a mesh screen sheet protective member disposed between said sheet feed path and said heater unit, said sheet protective member further comprising filaments of glass fibers and having a plurality of holes defined therein for passing a heated air from said heater unit toward said sheet feed path.

4. A sheet heating device according to claim 3, wherein said filaments are divided into two sets of filaments, the filaments of one set extending along said sheet feed path and the filaments of the other set extending transversely to said sheet feed path.

5. A sheet heating device according to claim 4, wherein said filaments of one set are positioned more closely to said sheet feed path than said filaments of the other set.

6. A sheet heating device according to claim 5, wherein said two sets of filaments are joined to each other at their intersecting points.

7. A sheet heating device according to claim 3, further including a roller for discharging the sheet heated by said heater unit, said sheet protective member being progressively inclined toward said sheet feed path along a direction toward said roller.

8. A sheet heating device according to claim 4, further including a roller for discharging the sheet heated by said heater unit, said filaments of one set providing a sheet guide surface facing said sheet feed path, for guiding the sheet toward said roller.

9. A sheet heating device according to claim 8, wherein said sheet guide surface is progressively inclined toward said sheet feed path along a direction toward said roller.

10. A sheet heating device according to claim 3, wherein said filaments are divided into two sets of filaments, said two sets of filaments lying in a plane substantially parallel to said sheet feed path and being inclined to said sheet feed path.

11. A sheet heating device according to claim 10, wherein said two sets of filaments are arranged so as to intersect to a sheet feeding direction at a prescribed angle.

12. A sheet heating device for heating a sheet while the sheet is being fed, comprising:
   a sheet feed path along which the sheet is fed;
   a heater unit spaced from said sheet feed path; and
   a mesh screen protective member disposed fixedly between said sheet feed path and said heater unit, said mesh screen protective member having a plurality of holes defined therein for passing a heated air from said heater unit toward said sheet feed path.

* * * * *